United States Patent
Hell et al.

(10) Patent No.: US 10,700,886 B2
(45) Date of Patent: Jun. 30, 2020

(54) DRIVER APPARATUS FOR A DIFFERENTIAL BUS AND CORRESPONDING METHOD

(71) Applicant: Infineon Technologies AG, Neubiberg (DE)

(72) Inventors: Magnus-Maria Hell, Munich (DE); Dieter Metzner, Eichenau (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/443,583

(22) Filed: Jun. 17, 2019

(65) Prior Publication Data
US 2019/0394064 A1  Dec. 26, 2019

(30) Foreign Application Priority Data
Jun. 20, 2018 (DE) .................. 10 2018 114 759

(51) Int. Cl.
| | |
|---|---|
| *H04L 12/413* | (2006.01) |
| *H04W 74/08* | (2009.01) |
| *H03F 3/45* | (2006.01) |
| *H04L 12/40* | (2006.01) |

(52) U.S. Cl.
CPC .... *H04L 12/40013* (2013.01); *H04L 12/4135* (2013.01); *H04W 74/0858* (2013.01); *H03F 3/45* (2013.01)

(58) Field of Classification Search
CPC . H04L 12/40013; H04L 12/4135; H03F 3/45; H04W 74/0858; H04W 74/0825; G06F 13/40
See application file for complete search history.

(56) References Cited

U.S. PATENT DOCUMENTS

| | | | |
|---|---|---|---|
| 9,495,317 B2 | 11/2016 | Metzner et al. | |
| 10,268,624 B2 | 4/2019 | Nickel | |
| 2013/0294460 A1 | 11/2013 | Hell | |
| 2013/0294540 A1 | 11/2013 | Hell | |
| 2015/0169488 A1* | 6/2015 | Metzner | G06F 13/4022 710/316 |
| 2015/0222594 A1 | 8/2015 | Fritsch | |
| 2018/0254918 A1* | 9/2018 | Rocher | H04L 12/40013 |

FOREIGN PATENT DOCUMENTS

| | | |
|---|---|---|
| DE | 102013214870 A1 | 2/2015 |
| DE | 102014118156 A1 | 6/2015 |
| DE | 102018104732 B3 | 2/2019 |

OTHER PUBLICATIONS

Office Action, in the German language, from counterpart German Application No. 102018114759.7, dated Apr. 29, 2019, 14 pp.

* cited by examiner

*Primary Examiner* — John W Poos
(74) *Attorney, Agent, or Firm* — Shumaker & Sieffert, P.A.

(57) ABSTRACT

A driver apparatus for a differential bus is provided, having a first transistor and a fourth transistor which are connected in order to drive the bus to a dominant state, and a second transistor and a third transistor which are connected in order to drive the bus to a recessive state. The driver apparatus also comprises a collision detection circuit which is set up to detect a collision state on the bus on the basis of measurements of currents through at least one transistor of the first, second, third and fourth transistors.

25 Claims, 5 Drawing Sheets

DRIVER APPARATUS FOR A DIFFERENTIAL BUS AND CORRESPONDING METHOD

This Application claims priority to German Application Number 102018114759.7, filed on Jun. 20, 2018, the entire content of which is incorporated herein by reference.

TECHNICAL FIELD

The present application relates to driver apparatuses for a differential bus and to corresponding methods for operating a differential bus.

BACKGROUND

Buses are in widespread use in order to connect different components of a system to one another, with the result that the components can interchange data. The components connected to the bus are referred to as bus subscribers below. In this case, driver apparatuses are used to drive the bus to different states, in particular different current and/or voltage levels, in order to transmit data. In the case of CSMA/CR buses (carrier sense multiple access/collision resolution), collisions may occur if a plurality of components connected to the bus simultaneously drive the bus in order to transmit data. An example of such a CSMA/CR bus is the CAN bus (controller area network) which is in widespread use in automobile applications, for example. Another example is the RS232 bus.

In the conventional CAN bus, a driver apparatus actively drives a so-called dominant state, which represents a bit value of 0, in such a manner that a voltage difference is produced between two lines of the CAN bus. In a so-called recessive state, which represents a bit value of 1, a voltage difference between the lines of the bus conventionally changes to virtually 0 V without active driving via a resistor which connects the lines. If, during this conventional approach, a driver apparatus of one bus subscriber drives the bus to a dominant state, while the driver apparatus of another bus subscriber is passively switched to a recessive state, the dominant state dominates and the bus overall assumes the dominant state with a voltage difference between the bus lines.

In this conventional approach, so-called ringing, that is to say oscillations on the bus which can interfere with communication, can occur during the transition from the dominant state to the recessive state. In order to suppress this ringing, approaches to also actively drive the recessive state or at least actively drive a transition from the dominant state to the recessive state are pursued. However, this may be problematic with respect to collisions if one bus subscriber actively drives the bus to the dominant state and another bus subscriber simultaneously actively drives the bus to the recessive state.

SUMMARY

A driver apparatus according to claim 1 and a method according to claim 12 are provided. The subclaims define further embodiments.

One exemplary embodiment provides a driver apparatus for a differential bus. The driver apparatus has a first transistor and a fourth transistor which are connected in order to drive the bus to a dominant state. The driver apparatus also has a second transistor and a third transistor which are connected in order to drive the bus to a recessive state. Finally, the driver apparatus has a collision detection circuit which is set up to detect a collision state on the bus on the basis of measurements of currents through at least one transistor of the first, second, third and fourth transistors.

Another embodiment provides a method for driving a differential bus. The method comprises:

controlling a first transistor and a fourth transistor in order to drive the bus to a dominant state, controlling a second transistor and a third transistor in order to drive the bus to a recessive state, measuring currents through at least one transistor of the first, second, third and fourth transistors, and detecting a collision state on the bus on the basis of the measured currents.

The above summary is used only as a short overview of some embodiments and should not be interpreted as being restrictive.

DETAILED DESCRIPTION

Different embodiments are explained in more detail below with reference to the accompanying drawings. These embodiments are used only for illustration and should not be interpreted as being restrictive. Whereas embodiments having a multiplicity of features (components, method processes, elements and the like) are described, other embodiments may have fewer components and/or alternative components. In addition to the features explicitly illustrated and described, it is also possible to provide further features, in particular components used in conventional bus systems such as CSMA/CR bus systems, for example CAN bus systems.

Even if a CAN bus is used as an example of such a CSMA/CR bus for better illustration in the following description of embodiments, the techniques described can also be applied to other bus systems, in particular CSMA/CR bus systems, for example RS232 buses.

Variations and modifications described for one of the embodiments can also be applied to other embodiments and are therefore not described repeatedly. Features of different embodiments described can also be combined in order to form further embodiments.

In the figures, identical reference signs denote identical or mutually corresponding elements. These elements are therefore likewise not described repeatedly.

Figure 1:
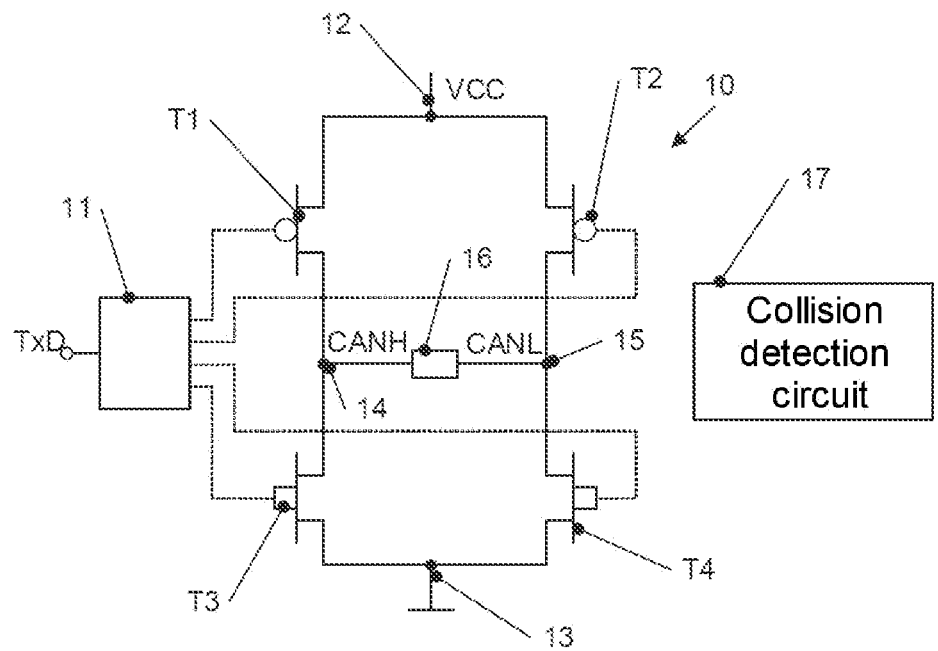
FIG. 1 is a diagram of a driver apparatus according to some embodiments.

FIG. 1 shows a driver apparatus according to one embodiment for driving a bus. The driver apparatus in FIG. 1 in this case drives a CAN bus having a first bus line CANH, which is coupled to a first output connection 14 of the driver apparatus, and a second bus line CANL, which is connected to a second output connection 15 of the driver apparatus. The bus lines CANH, CANL are connected to one another via a resistor 16, of the order of magnitude of 60 ohms in the case of CAN buses. In many implementations, the resistor 16 is outside the driver apparatus.

The driver apparatus in FIG. 1 is supplied with a voltage supply potential, in particular a positive supply voltage Vcc, at a first voltage connection 12 and is coupled to ground at a second voltage connection 13 in the example in FIG. 1. Instead of Vcc and ground, other voltage supply potentials can also be used.

The driver apparatus in FIG. 1 comprises a first transistor T1, a second transistor T2, a third transistor T3 and a fourth transistor T4 which are controlled by a control circuit 11 on the basis of a transmission signal TxD, which represents data to be transmitted, in order to be opened and closed. In the following description, a transistor is referred to as "open" or "off" if it is substantially non-conductive, that is to say substantially does not provide a conductive connection (apart from any undesirable leakage currents), between its load connections (source and drain or collector and emitter). A transistor is referred to as "closed" or "on" if it provides an electrical connection between its load connections, with the result that current can flow. It should be noted that, that depending on the applied control voltage (gate voltage or base voltage) and depending on the transistor design, such an electrical connection may also definitely have a non-negligible impedance, for example a few 10 ohms, but may also have a low impedance (<5 ohms or <1 ohm) in other implementations.

In order to drive a dominant state, the first transistor T1 and the fourth transistor T4 are closed and the second transistor T2 and the third transistor T3 are opened. The connection 14 is therefore connected to the control voltage connection 12 via the transistor T1 and the connection 15 is connected to the voltage connection 13 via the transistor T4. This produces a voltage difference between the bus lines CANH, CANL.

The transistors T1 and T4 correspond in this case to transistors which are also used in the conventional CAN driver apparatus mentioned at the outset.

In a conventional driver apparatus, the transistors T1, T4 are opened for the recessive state, with the result that potential equalization is passively carried out between the connections 14, 15 via the resistor 16, that is to say the voltage difference between the bus lines changes to 0. In the driver apparatus in FIG. 1, the second transistor T2 is additionally connected between the voltage connection 12 and the connection 15 and the third transistor T3 is connected between the connection 14 and the voltage connection 13. As explained below, these transistors are used to actively drive the bus to the recessive state. The possibilities for this are explained later with reference to FIGS. 2 to 4.

The embodiment in FIG. 1 also comprises a collision detection circuit 17 in order to detect collisions on the bus (on the CAN bus in the example in FIG. 1) which can be produced by actively driving to the recessive state using the transistors T2, T3 if another bus subscriber simultaneously drives the bus to a dominant state. For this purpose, the collision detection circuit 17 measures currents through at least two of the transistors T1 to T4 and determines whether there is a collision state on the bus on the basis of these currents. For this purpose, the currents can be compared with one another, in particular. As explained in more detail below, the measurement of two currents through two of the transistors T1 to T4 suffices to detect a collision state in many cases. In some embodiments, however, currents through all four transistors T1 to T4 are measured, which provides redundancy in the measurement. Examples of the collision detection circuit 17 and the collision detection are likewise explained in more detail below.

As already mentioned, various possibilities of how the bus can be driven to a recessive state by means of the transistors T2, T3 are first of all explained with reference to FIGS. 2 to 4.

Figure 2:
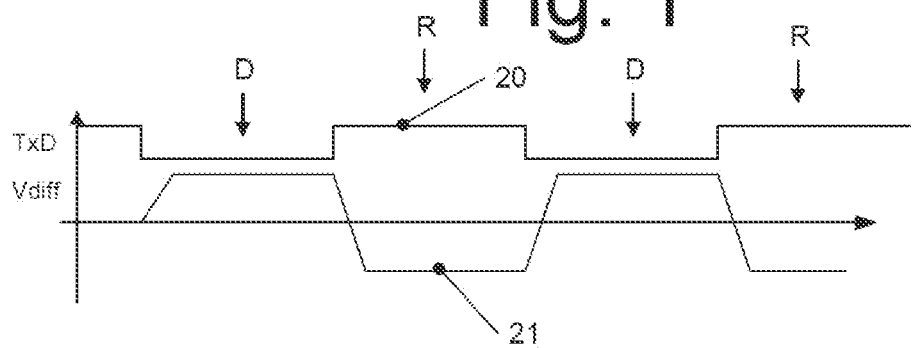
FIGS. 2 to 4 explain different possibilities for actively driving a recessive state in the embodiments from FIG. 1.
Figure 3:
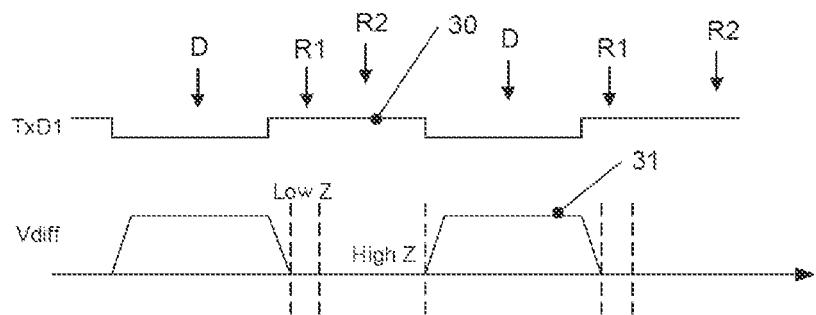
Figure 4:
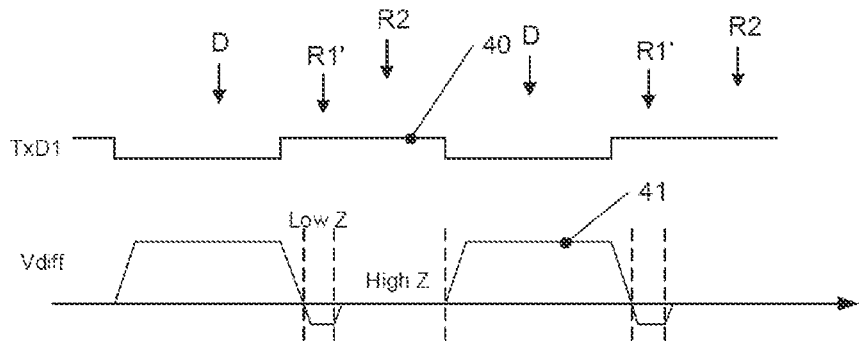

In this case, FIGS. 2 to 4 show signals for different possibilities for driving the bus. In this case, the illustrated signal waveforms are used only for illustration and can vary in this case depending on the implementation, bus used and data to be transmitted.

In FIG. 2, a curve 20 shows an example of the transmission signal TxD which is supplied to the control circuit 11 in the embodiment in FIG. 1. In the case of a low level of the signal TxD (logic 0), the bus is driven to a dominant state, indicated using "D" in FIG. 2, and, in the case of a high level of the signal TxD (logic 1), the bus is driven to a recessive state (indicated using "R" in FIG. 2). In the example in FIG. 2, the transistors T1 and T4 are closed and the transistors T2 and T3 are opened in the dominant state. The transistors T1 and T4 are opened and the transistors T2 and T3 are closed in the recessive state.

A curve 21 shows a differential voltage Vdiff between the connection 14 and the connection 15 in FIG. 1. The differential voltage Vdiff is positive (Vcc in the example in FIG. 1 if the ground potential is considered to be zero) in the dominant state and Vdiff is negative (minus Vcc in the example in FIG. 1) in the recessive state. In contrast, Vdiff would be 0 in the recessive state in the case of a conventional CAN bus.

A further possibility for driving to a recessive state is shown in FIG. 3. A curve 30 shows the transmission signal TxD in a similar manner to the curve 20 in FIG. 2. In the example in FIG. 3, the dominant phase is driven as in FIG. 2, that is to say the transistors T1, T4 are closed and the transistors T2, T3 are open during the dominant phase. In the example in FIG. 3, the recessive state is subdivided into two phases, denoted R1 and R2. In the first phase R1, also referred to as the "LowZ" phase, all four transistors T1 to T4 are closed for a short period. This short period may last, for example, for between 200 ns and 400 ns, for example approximately 300 ns. This closing of all transistors T1 to T4 actively drives the voltage level on the bus to the recessive state, in this case to Vdiff=0. In the second phase R2, all transistors T1 to T4 are then opened (also referred to as the "HighZ" state), which corresponds to the conventional passive state of the driver in the recessive state. A curve 31 in turn shows the differential voltage Vdiff on the bus for this example. Here, the voltage levels substantially correspond to the voltage levels of the conventional CAN bus, that is to say a positive voltage difference between the connections 14, 15 in the dominant state and a voltage difference of substantially 0 in the recessive state.

A third possibility is shown in FIG. 4. In FIG. 4, a curve 40 again shows the transmission signal TxD and a curve 41 shows the differential voltage between the connections 14, 15 in FIG. 1. The dominant phase, again indicated using "D", is driven as described in that the transistors T1 and T4 are closed and the transistors T2 and T3 are open. The recessive phase is again subdivided into two sections, denoted R1' and R2 in FIG. 4. In the phase R1', the differential voltage is driven to a slightly negative level. This can be carried out, for example, by closing all transistors T1 to T4 during the phase R1', but the transistors T2 and T3 (as a result of the design or choice of the control signal) have a lower impedance in the closed state than the transistors T1 and T4. After the phase R1', the phase R2 is carried out in a manner corresponding to the phase R2 in FIG. 3 in which all transistors T1 to T4 are open and the driver circuit is therefore passive.

In all variants in FIGS. 2 to 4, the ringing mentioned at the outset can be at least partially suppressed. However, collisions may occur in all variants if, during the recessive phase R in FIG. 2 or during the phase R1 or R1' in FIGS. 3 and 4, another bus subscriber attempts to drive the bus to a dominant state. This is now explained with reference to FIGS. 5 and 6.

Figure 5:
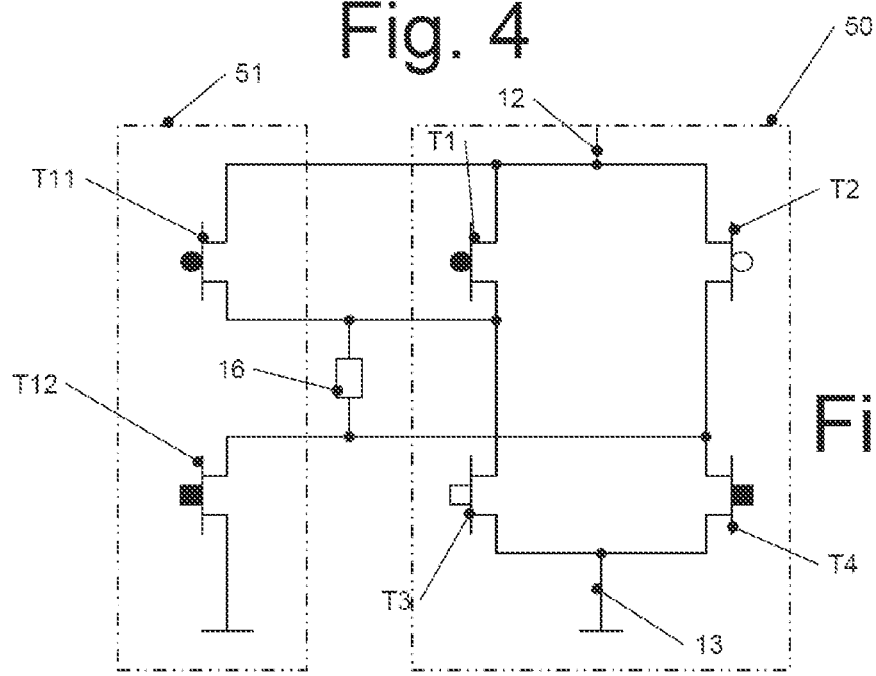
FIG. 5 is a circuit diagram for illustrating possible bus collisions.

FIG. 5 shows the transistors T1 to T4 from FIG. 1, which are connected between the voltage connection 12 and the voltage connection 13, as part of a transistor circuit 50. A further bus subscriber 51 is likewise connected to the bus. The further bus subscriber 51 has a transistor T11 and a transistor T12 which are both closed for the purpose of driving a dominant state on the bus. If the transistor circuit 50 simultaneously attempts to actively drive the bus to a recessive state by closing the transistors T2 and T3 (and additionally the transistors T1, T4 during driving in the phase R1 or R1' as in FIGS. 3 and 4), a collision arises. This is explained in more detail with reference to FIG. 6.

Figure 6:
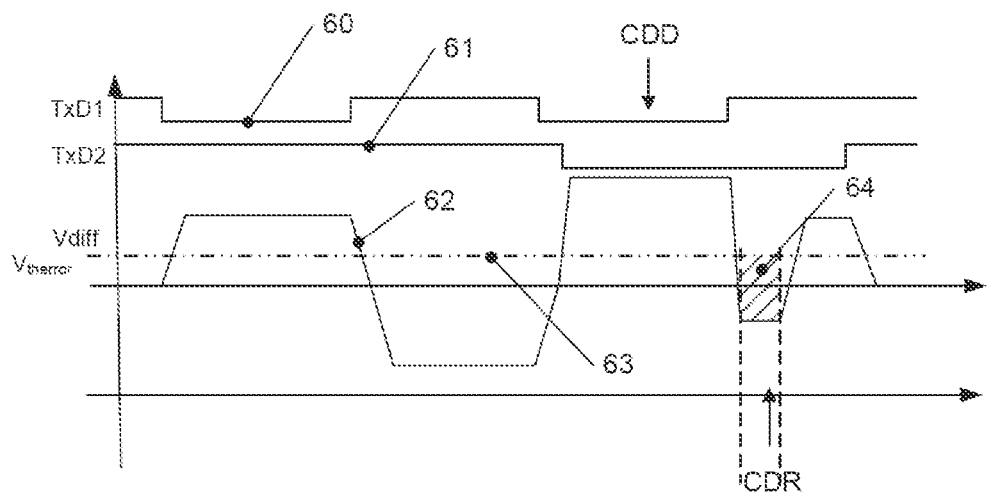
FIG. 6 illustrates signals in a bus collision.

In FIG. 6, a curve 60 shows an example of a transmission signal TxD1 for the transistor circuit 50 corresponding to the transmission signal TxD which has already been discussed, and a curve 61 shows a transmission signal TxD2 for the further bus subscriber 51. In this case, it is assumed that the further bus subscriber 51 has a conventional CAN driver as in FIG. 5, that is to say a driver which is set up to actively drive a dominant state, while, in a recessive state, the transistors T11, T12 are both open and no further transistors or other devices are used to actively drive the recessive state. The further bus subscriber therefore behaves like the transistor circuit 50 in the dominant state, whereas it is purely passive in the recessive state. However, this is merely an example and collisions can also occur, as explained below, if the further bus subscriber 51 is implemented like the transistor circuit 50 with four transistors and is also set up to actively drive to a recessive state.

A curve 62 shows the differential voltage Vdiff on the differential bus, corresponding to the voltage between the connections 14 and 15 in FIG. 1. In this case, in the example in FIG. 6, it is assumed that the transistor circuit 50 drives the recessive state, as explained with reference to FIG. 2, that is to say the transistors T2 and T3 are closed and the transistors T1 and T4 are opened.

The transmission signal TxD2 corresponding to the curve 61 is first of all at a high level corresponding to a recessive state. The voltage Vdiff is therefore initially determined by the transistor circuit 50. The voltage is driven to a positive value in the dominant state and is driven to a negative value in the recessive state.

In a section which is denoted CDD in FIG. 6, both transmission signals TxD1, TxD2 according to the curves 60, 61 are at a low level, with the result that both bus subscribers 50, 51 drive the bus to a dominant state. In this case, a higher voltage Vdiff results than in the case in which only one of the bus subscribers drives the bus to the dominant state. However, this is not a problem in many cases since the bus state is still identified as dominant (for example by comparing Vdiff with a threshold value) and both bus subscribers 50, 51 wish to drive the bus to a dominant state.

In a section denoted CDR, the transmission signal TxD1 according to the curve 60 indicates a recessive state and the transmission signal TxD2 according to the curve 61 shows a dominant state. Accordingly, the transistors T2 and T3 are closed in the transistor circuit 50 and the transistor circuit 50 attempts to drive the voltage on the bus to a negative value. At the same time, the transistors T11 and T12 of the further bus subscriber 51 are closed and the further bus subscriber 51 attempts to drive the differential voltage Vdiff to a positive value. A value of the voltage Vdiff which is established therefore depends on the dimensions and control voltages of the transistors T11, T12, T2 and T3 and, as indicated by a region 64 in FIG. 6, may be a negative value or a positive value, for example in a range between +1 V and −1 V. In particular, it may be below a threshold voltage indicated by a line 63, below which errors can occur since a dominant level (which should actually be present on the bus in this situation) is no longer detected. The threshold voltage indicated by the line 63 may be, for example, a threshold voltage, on the basis of which a dominant state on the bus is detected by comparing the voltage Vdiff with this threshold voltage. In contrast to this, as explained at the outset, the dominant state dominates in the event of a conflict between dominant and recessive in a conventional CAN bus system, that is to say the state on the bus is dominant overall and is identified as such.

In embodiments, such collisions are therefore detected, for example by means of the collision detection circuit 17 in FIG. 1, by measuring currents through at least two of the transistors T1 to T4 and detecting a collision state on the basis of the measured currents. If a collision state is detected, all transistors T1 and T4 are opened in some embodiments, with the result that the state of the transistor circuit 50 corresponds substantially to a conventional passive recessive state. In this case, the voltage Vdiff, driven by the further bus subscriber 51, then rises to a positive level, with the result that the bus overall has a dominant state.

Figure 7:
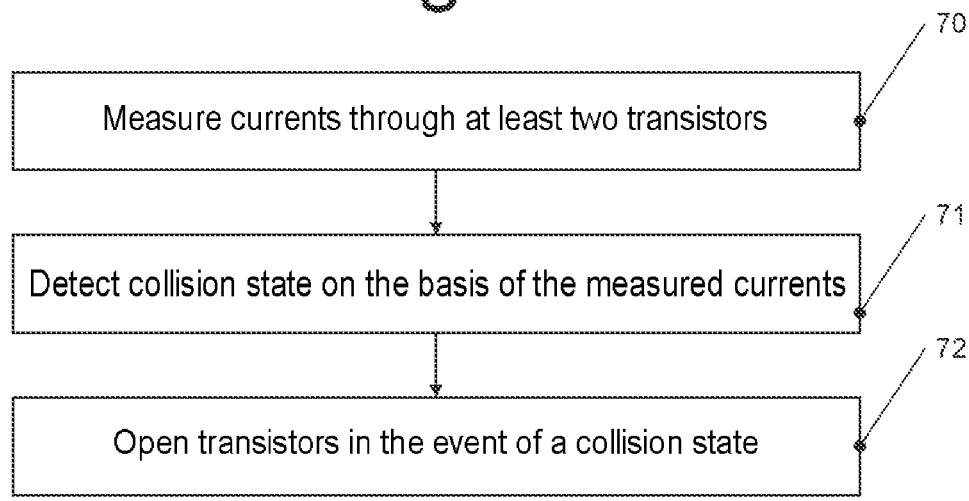
FIG. 7 shows a flowchart for illustrating a method according to some embodiments.

This procedure according to some embodiments is illustrated in FIG. 7. The method in FIG. 7 can be carried out, in particular, by means of the driver apparatus in FIG. 1 or else with driver apparatuses described below, but can also be implemented independently thereof.

At 70 in FIG. 7, currents through at least two transistors of an apparatus, such as the apparatus in FIG. 1, are measured. A collision state is detected at 71 on the basis of the measured currents. The transistors are opened at 72 if a collision state is detected. In this manner, the driver apparatus is changed to a passive state in a manner corresponding to a conventional CAN driver apparatus.

Figure 8:
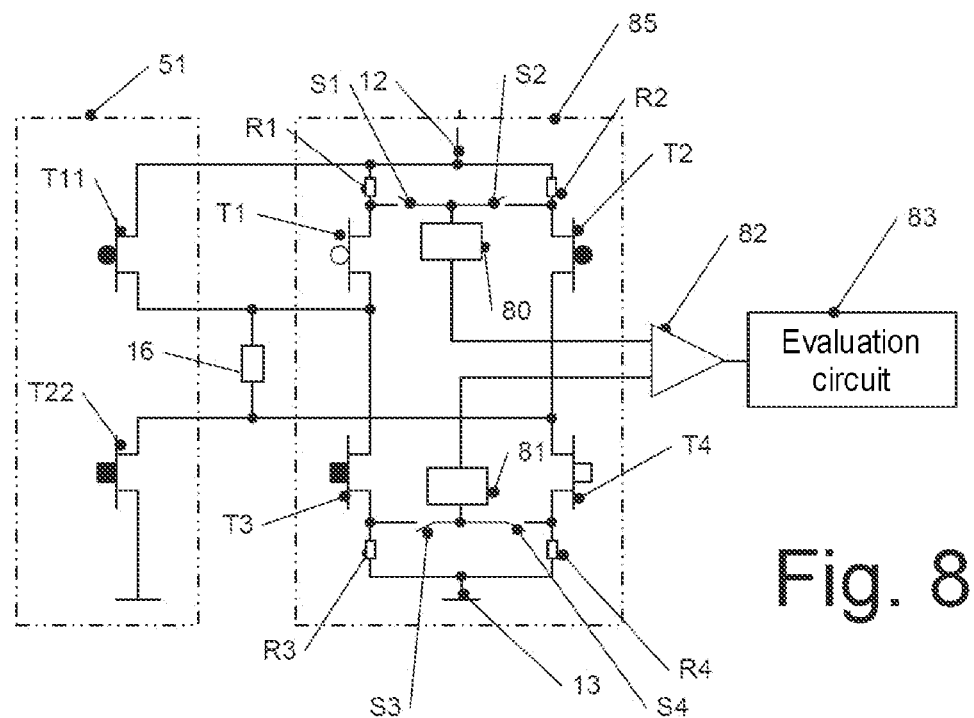
FIG. 8 shows a driver apparatus according to some embodiments.

Specific examples of collision detection circuits and criteria relating to how a collision state can be detected on the basis of measured currents are now explained with reference to FIGS. 8 to 11. In this case, FIG. 8 shows a driver apparatus according to one exemplary embodiment which has a transistor circuit 85 having the transistors T1 to T4, as already discussed. In this case, the driver apparatus having the transistor circuit 85 is a first bus subscriber in the example in FIG. 8 and, for the purpose of illustrating collision states, the further bus subscriber 51 having the transistors T11 and T12 which has already been explained with reference to FIG. 5 is also connected to the bus.

Figure 9:
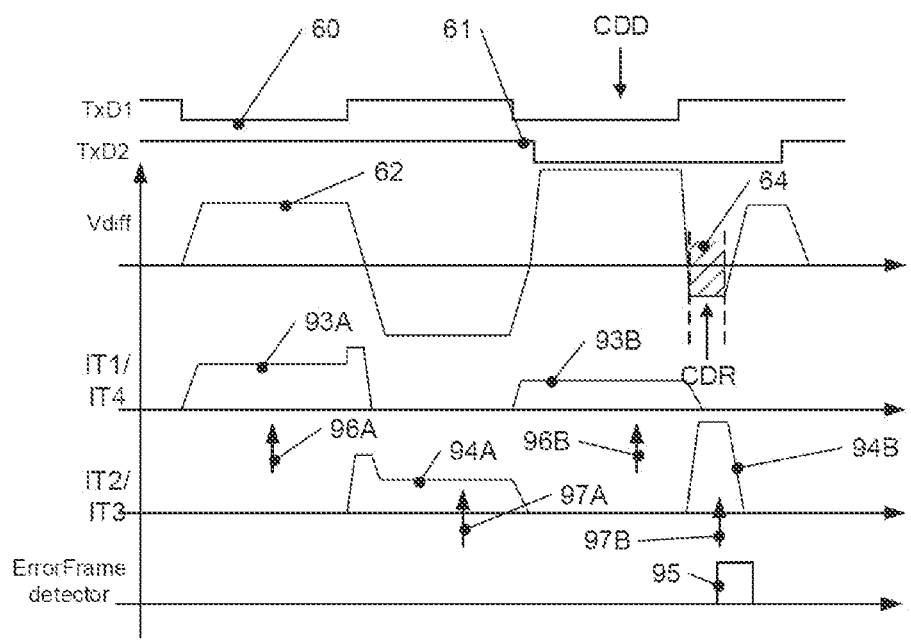
FIG. 9 shows exemplary signals for the embodiments from FIG. 8.

FIG. 9 shows exemplary signals for the system shown in FIG. 8.

In the embodiment in FIGS. 8 and 9, active driving to a recessive state, like in FIG. 2, is assumed, that is to say the transistors T1 and T4 in the transistor circuit 85 are closed and the transistors T2 and T3 are open for the purpose of driving a dominant state, and the transistors T1 and T4 are opened and the transistors T2 and T3 are closed for the purpose of driving a recessive state.

In the embodiment in FIG. 8, the transistor circuit 85 comprises a first shunt resistor R1 connected in series with the first transistor T1, a second shunt resistor R2 connected in series with the second transistor T2, a third shunt resistor R3 connected in series with the third transistor T3 and a fourth shunt resistor R4 connected in series with the fourth transistor T4. The shunt resistors R1 to R4 are each used to measure a respective current IT1 to IT4 through the respective transistor T1 to T4 by measuring a voltage drop across the respective shunt resistor which is caused by the current. Resistance values of the shunt resistors R1 to R4 are accordingly selected to be small, for example <5 ohms or <1 ohm, and are lower than resistance values of the respective transistors T1 to T4 in the closed state in embodiments.

In order to measure the voltage drop across the resistor R1, which corresponds to the current IT1 through the first transistor T1, a switch S1 is closed in order to connect a node between the resistor R1 and the transistor to a sample-and-hold circuit 80. In order to measure a current IT2 through the transistor T2, a node between the shunt resistor R2 and the second transistor T2 is connected to the sample-and-hold circuit 80 via a switch S2. In a corresponding manner, in order to measure a current IT3 through the third transistor T3, a node between the shunt resistor R2 and the third transistor T3 is connected to a sample-and-hold circuit 81 and, in order to measure a current through the fourth transistor T4, a node between the shunt resistor R4 and the fourth transistor T4 is connected to the sample-and-hold circuit 81 via a switch S4.

As a result of the switches S1, S2 and S3, S4, two transistors (T1 and T2 and T3 and T4) therefore always "share" a sample-and-hold circuit 80 or 81. The currents can be measured and stored by means of the sample-and-hold circuit. In particular, the currents IT1 and IT4 through the first transistor T1 and the fourth transistor T4 are measured, while the bus is driven to a dominant state by means of the transistor circuit 85. It should be noted that the currents IT1 and IT4 are generally the same since a current flows from the voltage connection 12, via the first transistor T1, the resistor 16 and the fourth transistor T4, to the voltage connection 13. During a recessive phase, the currents IT2 and IT3 are measured and are again the same since current flows here from the voltage connection 12, via the transistor T2 and the resistor 16 and the fourth transistor T4, to the voltage connection 13. Instead of the shunt resistors R1 to R4, it is also possible to use other conventional current measurement approaches, for example current measurements based on magnetic field sensors which measure a magnetic field generated by the current or capture transistors which are connected to the transistors T1 to T4 in order to conduct a defined fraction of the current through the transistors T1 to T4.

The currents IT1 and IT4 are therefore measured in the dominant phase and the currents IT2 and IT3 are measured in the recessive phase and are stored by means of the sample-and-hold circuit 80 or 81.

The results of the current measurements are compared in a comparator 82 via the sample-and-hold circuits 80, 81 and a result of the comparison is evaluated by an evaluation circuit 83.

In one implementation in which the transistors T1 to T4 are designed and controlled in an approximately identical manner, with the result that they have approximately the same impedances in the closed state, or in which the transistors T1 and T4 in the closed state have a somewhat lower impedance than the transistors T2 and T3 in the closed state, one of the currents IT1, IT4 can be respectively compared with one of the currents IT2, IT3. In this case, a collision state is detected by the evaluation circuit when IT1 and/or IT4 is/are lower than IT2 and/or IT3. In this case, "and/or" should be understood in the sense of an inclusive or, that is to say one of the currents can be used in each case or both currents can be used. In some embodiments, only two currents are measured, namely one of IT1 and IT4 and one of IT2 and IT3, and the two measured currents are compared. In other embodiments, all four currents IT1 to IT4 are measured, as shown in FIG. 8, and are compared in pairs, for example IT1 with IT2 and IT3 with IT4, and there is a collision state if IT1<IT2 and IT4<IT3. For example, IT1 can also be compared with IT3 and IT2 can be compared with IT4 (cf. the above statements with respect to the identity of the currents).

As a result of all four currents being measured and a plurality of comparisons being carried out, redundancy can be ensured and a collision state can be detected, for example, only when both comparisons indicate a collision state. For example, IT1 can be compared with IT2 and IT3 can be compared with IT4 and a collision state can be detected if IT1<IT2 and IT4<IT3. This can increase the reliability of the measurement. However, as mentioned, it is fundamentally sufficient to measure only one of the currents IT1, IT4 and one of the currents IT2, IT3. In such embodiments, one of the sample-and-hold circuits 80, 81 can then be omitted, for example.

In the case of such a design and control of the transistors, a collision state is therefore detected overall in some exemplary embodiments if the first current and/or the fourth current is/are lower than the second current and/or the third current, in which case the conjunction "and/or" should be understood in the sense of an inclusive or and to the effect that one of the two currents or both currents can be used for the comparison.

The above evaluation is now explained with reference to FIG. 9 on the basis of exemplary signals.

In FIG. 9, the curves 60 to 62 correspond to those in FIG. 6, that is to say the curve 60 represents a first transmission signal TxD1, on the basis of which the transistors T1 to T4 are controlled, the curve 61 represents a second transmission signal TxD2, on the basis of which the transistors T11, T12 of the further bus subscriber 51 are controlled, and the curve 62 shows the differential voltage Vdiff on the bus. A curve section 93A represents the first current IT1 and the second current IT4 (which, as explained above, are the same) during a phase in which the transistor circuit 85 drives a dominant state onto the bus and the further bus subscriber 51 is passive (recessive state). The first current IT1 and the fourth current IT4 are sampled, for example at a time in the middle of this phase (for example in the middle of a respective bit to be transmitted), by means of these sample-and-hold circuits 80, 81, as indicated by an arrow 96A. A curve section 93D represents the currents IT1 and IT4 during the phase which is denoted CDD and in which both the transistor circuit 85 and the further bus subscriber 51 drive a dominant state onto the bus, and an arrow 96B again represents a sampling time for the currents IT1, IT4. In this case, the currents IT1, IT4 are somewhat lower than in the curve 93A.

A curve section 94A shows the currents IT2 and IT3 during a time in which the transistor circuit 85 actively drives a recessive state, while the further bus subscriber 51 is still passive (recessive). An arrow 97A shows a corresponding sampling time for the sample-and-hold circuits 80, 81. In order to determine a collision state, the IT1/IT4 sampled during the curve 93A are compared with the currents IT2/IT3 sampled during the curve 94A. These currents are approximately the same in the case of the explained approximately identical design and control of the transistors or, in the case in which the impedance of the transistors T1 and T4 in the switched-on state is somewhat lower than the impedance of the transistors T2 and T3 in the closed state, IT2/IT3 are somewhat lower than IT1/IT4, which indicates that there is no collision state on the bus. In this case, the exact level of the currents IT/IT4 and IT2/IT3 depends, inter alia, on the dimensioning of the transistors.

A curve 94B shows the currents IT2 and IT3 during a collision state in which the transistor circuit 85 actively drives a recessive state and the further bus subscriber 51 drives a dominant state, that is to say the collision state to be detected.

A curve section 94B shows the currents IT2/IT3 for this situation which are sampled at a time represented by an arrow 97B. In this case, the currents IT2 and IT3 are considerably higher and, in particular, higher than the currents IT1 and IT4, both during the curve 93A at the sampling time 96A and during the curve 93B at the sampling time 96B. This is due to the fact that an additional current flows through the transistor IT2 in this case from the voltage connection 12 via the transistor T11 and the transistor T3 and an additional current flows through the transistor T2 from the voltage connection 12 through the transistor T2 and the transistor T22, in each case without the resistor 16.

Therefore, a collision state on the bus can be detected by detecting that the currents IT1 and/or IT4 is/are lower than the currents IT2 and/or IT3. An error signal 95, which is also referred to as an "error frame" signal, is output in response to the detection. In response to this, a bit currently being transmitted on the bus can be discarded and/or the transistors T1 to T4 can all be opened in order to switch the transistor circuit 85 to a high-impedance state and to therefore end the active driving of the recessive state, whereupon the dominant state driven by the further communication subscriber 51 is established on the bus.

As explained, the above evaluation relates to a case in which the impedances of the transistors T1 to T4 in the switched-on state are approximately the same or the impedances of the transistors T1 and T4 in the closed state are somewhat lower than those of the transistors T2 and T3. If, however, the transistors are designed and controlled, for example, in such a manner that the impedance of the transistors T2, T3 in the closed state is lower than the impedance of the transistors T1, T2 in the closed state, IT2, IT3 may also be higher than IT1, IT4 without a collision. However, the circumstances on which the above evaluation is based may also be used for evaluation in such a case and in other cases.

Irrespective of the design and control of the transistors, it is specifically true that, in the case of a collision of dominant states (which is generally not critical, as mentioned), IT1/IT4 is/are lower than in the case in which only one dominant state is present as a result of the transistor circuit 85. Based on the example in FIG. 9, this means that the currents IT1, IT4 are lower at 93B than at 93A. In addition, in the event of the collision between actively driving a recessive state and a dominant state (CDR in FIG. 9), IT2 and IT3 are higher than in the case without a collision. Based on the example in FIG. 9, this means that IT2 and IT3 are higher at 97B than IT2 and IT3 at 97B.

This results in the following possibilities for detecting collisions:

In order to detect a collision between an actively driven recessive state and a dominant state (CDR in FIG. 9), IT2 and/or IT3 can be compared with a threshold value IR23. This threshold value is selected in such a manner that it is between the current values with and without a collision, between the values of IT2 and IT3 at 97A and 97B in the example in FIG. 9.

Instead of a fixed threshold value, values of IT2, IT3 can also be compared with one another at successive sampling times and a rise above a threshold value can be interpreted as a collision. In the example in FIG. 9, IT2 and/or IT3 at 97B can therefore be compared with IT2 and/or IT3 at 97A. This corresponds to dynamic adaptation of the threshold value based on a preceding measurement. Other dynamic adaptations of this threshold value or of other threshold values mentioned here are also possible, for example for the purpose of compensating for fluctuations in the measured currents on account of temperature fluctuations.

Finally, a difference between IT2/IT3 and IT1/IT4 can also be compared with a threshold value, for example the difference IT2-IT1 (and/or IT3-IT1, IT2-IT4 etc.) at successive sampling times (IT2/IT3 at 97A minus IT1/IT4 at 96A, then IT2/IT3 at 97B minus IT1/IT4 at 96B), or successive differences can be compared with one another.

In order to detect a collision between two dominant states, if this detection is desired, IT1 and/or IT4 can finally also be compared with a threshold value IR14 and a collision can be detected if the threshold value is undershot. In the example in FIG. 9, this threshold value is then between the values of IT1/IT4 at 96A and 96B.

References to "and/or", "IT2/IT3", "IT1/IT4" and the like should again be understood as meaning the fact that one of the currents can be used for comparison or else both currents can be used in order to provide redundancy, as explained.

Figure 10:
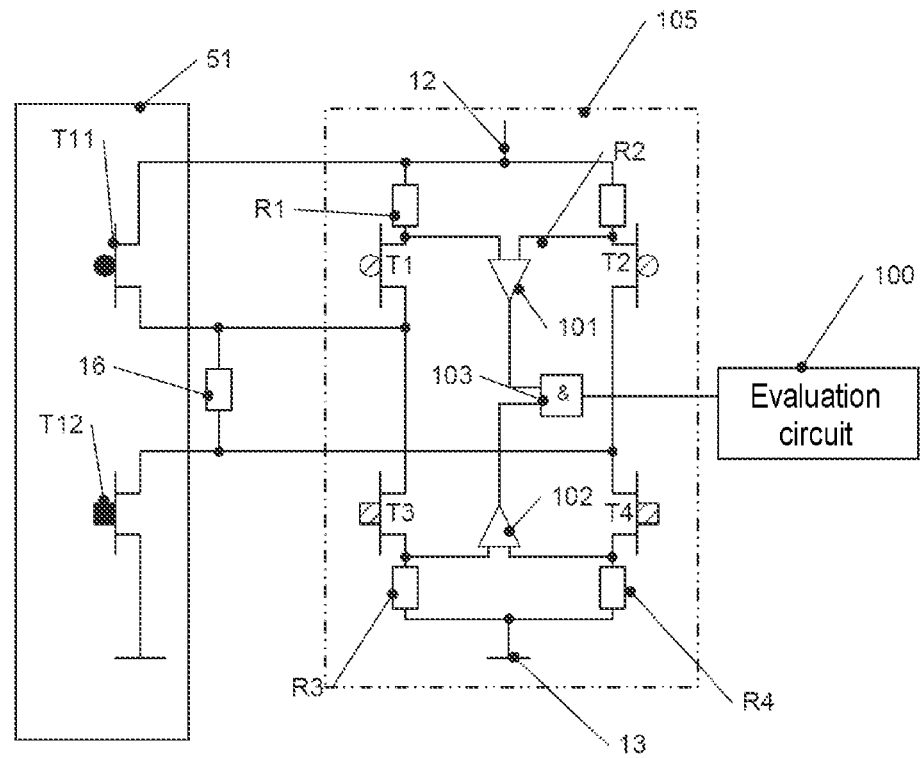
FIG. 10 shows a driver apparatus according to further embodiments.
Figure 11:
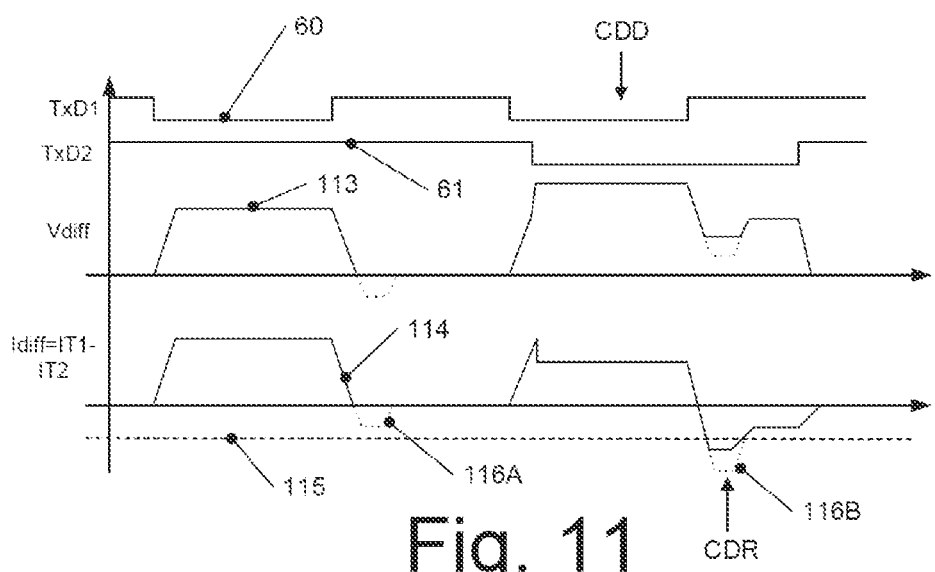
FIG. 11 shows exemplary signals for the embodiments from FIG. 10.

FIGS. 10 and 11 show an embodiment in which a collision state is detected on the basis of a current measurement in cases in which all four transistors T1 to T4 are closed for the purpose of driving the recessive state, as explained, for example, with reference to FIG. 3 and—with differently dimensioned transistors—with reference to FIG. 4.

FIG. 10 shows a corresponding system.

A driver apparatus according to the embodiment in FIG. 10 comprises a transistor circuit 105 and an evaluation circuit 100. It is coupled to the already discussed further bus subscriber 51 via a bus, again a CAN bus in the case of FIG. 10. The transistor circuit 105 comprises the transistors T1 to T4 which have already been discussed and the shunt resistors R1 to R4 which are assigned to the transistors T1 to T4 and have already been discussed with reference to FIG. 8.

In the embodiment in FIG. 10, all four transistors T1 to T4 are closed for the purpose of driving the recessive state, as briefly mentioned above. In this case, all four currents IT1 to IT4 through the four transistors T1 to T4 can be measured during this driving of the recessive state and a sample- and hold circuit is not necessary in some embodiments.

Collision detection is first of all explained again in an implementation in which the transistors T1 to T4 are designed and controlled in an approximately identical manner, with the result that they have approximately identical impedances in the closed state, as may be the case, for example, in the "Low Z" state in FIG. 3.

A node between the first shunt resistor R1 and the first transistor T1 is connected to a first input of a comparator 101 and a node between the second transistor T2 and the second shunt resistor R2 is connected to a second input of the comparator 101. As a result, the comparator 101 compares the currents IT1 and IT2. The comparator 101 may output a logic 1, for example, if IT1<IT2 and can otherwise output a 0. The reverse logic is fundamentally also possible.

Furthermore, a node between the third transistor T3 and the third shunt resistor R3 is connected to a first input of a comparator 102 and a node between the fourth transistor T4 and the fourth shunt resistor R4 is connected to a second input of the comparator 102. The comparator 102 can output a logic 1 if IT4<IT3 and can otherwise output a 0. If the reverse logic discussed above is used in the comparator 101, this is also the case for the comparator 102 in the exemplary embodiment in FIG. 10.

Outputs of the comparators 101, 102 are supplied to an AND gate 103. If both comparators 101, 102 output a logic 1 in the logic discussed above, the AND gate 103 outputs a logic 1, which is detected by the evaluation circuit 100 as a collision state. The use of two comparators 101, 102 and the AND gate 103 provides redundancy, with the result that, if only one of the comparators 101 or 102 outputs a logic 1, a collision state is not yet detected. If the reverse logic discussed above is used, a not-AND gate (NAND) can be used instead of the AND gate 103.

In other embodiments, only the currents IT1 and IT2 or only the currents IT3 and IT4 can also be measured and the AND gate 103 can be omitted. A collision state can also be detected in this manner, in which case no redundancy is then provided.

In the case of FIG. 10 as well, a criterion is therefore considered to be the fact that a collision state is detected if IT1 and/or IT4 is/are lower than IT2 and/or IT3 in the case of approximately identical design and control of the transistors T1-T4 and therefore approximately identical impedances.

In other embodiments, an OR gate can also be provided instead of the AND gate 103. In this case, a collision is already detected if one of the two comparisons in the comparators 101, 102 indicates a collision.

In other embodiments, it may be required, both in the embodiment in FIG. 8 and in the embodiment in FIG. 10, that IT1 is lower than IT2 by at least a predefined threshold value and/or IT4 is lower than IT3 by at least the predefined threshold value. In some embodiments, this makes it possible to avoid very small differences between the currents already resulting in the detection of a collision state.

The method of operation of the embodiment in FIG. 10 is now also explained on the basis of exemplary signals in FIG. 11. In FIG. 11, solid lines show the case in which the transistors T1-T4 have approximately the same impedance in the closed state.

In FIG. 11, the curve 60 is again used to show a transmission signal TxD1, on the basis of which the transistors T1 to T4 are controlled. The curve 61 shows the transmission signal TxD2, on the basis of which the transistors T11 and T12 are controlled.

A curve 113 shows the differential voltage Vdiff and a curve 114 shows the difference Idiff between the currents IT1 and IT2.

If the transistor circuit 105 drives a dominant state and the further bus subscriber 51 is passively recessive, the result is a positive current difference Idiff and a positive voltage on the bus. If the transistor circuit 105 then switches to the recessive state by closing all transistors T1 to T4 for a period, as explained with reference to FIG. 3, the current difference according to curve 114 is at 0 and the voltage Vdiff falls to 0 if the further bus subscriber 51 continues to be passive.

If both the transistor circuit 105 and the further bus subscriber 51 drive a dominant state (denoted CDD in FIG. 11), the result is a higher voltage Vdiff on the bus, which is not critical, and a positive current difference IT1-IT2 again, as already explained in FIG. 9.

If the transistor circuit 105 then closes all transistors T1 to T5 in order to actively drive to the recessive state (CDR in FIG. 11), while the further bus subscriber 51 continues to drive a dominant state, the result is the collision which has already been mentioned and a fall in the voltage Vdiff. In this case, the current difference IT1-IT2 becomes negative, as shown in FIG. 11, and the collision state can be detected by means of the current measurement. An error signal can then be transmitted by the evaluation circuit 100, like in the embodiment above, and/or the evaluation circuit 100 can open all transistors T1 to T4, with the result that the transistor circuit 105 changes to the high-impedance state and the transistor circuit 105 no longer actively drives the bus.

As explained, the above evaluation relates to a case in which the impedances of the transistors T1 to T4 in the switched-on state are approximately the same. If, however, the transistors are designed and controlled in such a manner, for example, that the impedance of the transistors T2, T3 in the closed state is lower than the impedance of the transistors T1, T2 in the closed state, IT2, IT3 may also be higher than IT1, IT4 without a collision. This may be the case, for example, in a "Low Z" state, as in FIG. 4, in which the differential voltage Vdiff is briefly driven to a slightly negative level by closing all transistors T1-T4. However, the circumstances on which the above evaluation is based can also be used for evaluation in such a case and in other cases. In FIG. 9, dotted curves show the deviations from the behavior discussed above in the case of driving to the recessive state, as shown in FIG. 4.

Irrespective of the design and control of the transistors, it is also specifically true in this case that, in the case of a collision of dominant states (which is generally not critical, as mentioned), IT1/IT4 is/are lower than in the case in which only a dominant state is present as a result of the transistor circuit 85. In the example in FIG. 11 for example, this means that the difference IT1-IT2 (or IT3-IT4 etc.) can also become negative without a collision, as shown at 116A. However, in the case of a collision between actively driving to the recessive state and a dominant state (CDR in FIG. 11), this difference is smaller, that is to say at a lower negative value, as shown at 116B in FIG. 11.

This results substantially in the same possibilities for detecting collisions as in the exemplary embodiment in FIG. 8/9.

In order detect a collision between an actively driven recessive state and a dominant state (CDR in FIG. 11), IT2 and/or IT3 can be compared with a threshold value IR23. This threshold value is selected in such a manner that it is between the current values with and without a collision.

Instead of a fixed threshold value, values of IT2, IT3 can also be compared with one another at successive sampling times and a rise above a threshold value can be interpreted as a collision.

Finally, a difference between IT2/IT3 and IT1/IT4 can also be compared with a threshold value, for example the difference IT2-IT1 (and/or IT3-IT1, IT2-IT4 etc.). As an example, a threshold value 115 is illustrated in FIG. 11 in this respect. In the case without a collision, Idiff is above this threshold value at 116A and, in the event of a collision, is below this threshold value at 116B. Alternatively, instead of a comparison with a fixed threshold value, successive values of Idiff during the "Low Z" phase (R1 in FIG. 3 and R1' in FIG. 4) can also be compared with one another here.

In order to detect a collision between two dominant states, if this detection is desired, IT1 and/or IT4 can finally also be compared with a threshold value IR14 and a collision can be detected if the threshold value is undershot. In the example in FIG. 9, this threshold value is then between the values of IT1/IT4 at 96A and 96B.

References to "and/or", "IT2/IT3", "IT1/IT4" and the like should again be understood as meaning the fact that one of the currents can be used for comparison or else both currents can be used in order to provide redundancy, as explained.

In this case too, a collision state can therefore be detected by means of a current measurement.

Exemplary values for voltages on the bus and the currents IT1 to IT3 for different states are also explained below:

| Further bus subscriber | Transistor circuit with T1-T4 | Vdiff Volts | IT1, IT4 [mA] | IT2, IT3 [mA] |
|---|---|---|---|---|
| Recessive | Dominant | 2 | 30 | 0 |
| Recessive | Recessive (Low Z) | 0(−0.3) | 40 | 40(50) |
| Recessive | Recessive (High Z) | 0 | 0 | 0 |
| Dominant | Dominant | 2.5 | 20 | 0 |
| Dominant | Recessive (LowZ) | 1.0(0.5) | 35 | 45(55) |
| Dominant | Recessive (High Z) | 0 | 0 | 0 |

The state of the further bus subscriber 51 is shown in the first column of this table, the described driver apparatus having the transistors IT1 to IT4 is shown in the second column. As can be seen, the collision states, in particular if the bus is actively driven to the recessive state, while the further bus subscriber drives the bus to a dominant state, can be detected by means of the discussed comparisons of currents. It is clear from these exemplary values that the criteria explained above can be used to detect collisions.

At least some embodiments are defined by the examples cited below: in this case, "and/or" should be understood in the sense of an inclusive or, that is to say both or one of the two, in which case redundancy can be provided by the "and" variant in some embodiments.

Example 1

Driver apparatus for a differential bus, having:
a first transistor and a fourth transistor which are connected in order to drive the bus to a dominant state,
a second transistor and a third transistor which are connected in order to drive the bus to a recessive state, and
a collision detection circuit which is set up to detect a collision state on the bus on the basis of measurements of currents through at least one transistor of the first, second, third and fourth transistors. A collision state can therefore already be detected by measuring a current through a transistor. For example, as described, the collision state between actively driving to a recessive state and a dominant state (CDR in the figures) can be detected by comparing a current through the second or third transistor with a threshold value, or a collision state between two dominant states (which is usually not critical) can be detected by comparing a current through the first or fourth transistor with a threshold value.

Example 2

Driver apparatus according to Example 1, wherein the at least one transistor comprises at least two transistors, wherein the collision detection circuit is set up to detect that there is a collision state on the bus if currents through the at least two transistors differ. In this case, at least two currents through two transistors are therefore measured and compared, which can be carried out by directly comparing the currents or by comparing a difference between the currents with a threshold value, as explained.

Example 3

Driver apparatus according to Example 1 or 2, wherein the collision detection circuit is set up to detect the collision state only if the driver apparatus drives the bus to the recessive state.

Example 4

Driver apparatus according to one of Examples 1-3, wherein the collision detection circuit is set up to open the first, second, third and fourth transistors if a collision state on the bus is detected. In some embodiments, the driver apparatus can therefore be changed to a passive state, as described.

Example 5

Driver apparatus according to one of Examples 1-4, wherein:
the first transistor is connected between a first voltage connection and a first connection for a first bus line of the bus,
the fourth transistor is connected between a second voltage connection and a second connection for a second bus line of the bus,
the second transistor is connected between the first voltage connection and the second connection, and
the third transistor is connected between the second voltage connection and the first connection.

Example 6

Driver apparatus according to Example 5, wherein
the collision detection circuit is set up to measure a first current through the first transistor and/or a fourth current through the fourth transistor, while the driver apparatus drives the bus to the dominant state.

Example 7

Driver apparatus according to Example 5 or 6, wherein
the collision detection circuit is set up to measure a second current through the second transistor and/or a third current through the third transistor, while the driver apparatus drives the bus to the recessive state. In Examples 6 and 7, currents are therefore measured in different phases (dominant and recessive). "And/or" again means in each case that one current or both currents is/are measured.

Example 8

Driver circuit according to Example 5, wherein the driver apparatus is set up to close the first transistor, the second transistor, the third transistor and the fourth transistor for a period for the purpose of driving the bus to the recessive state, wherein the collision detection circuit is set up to measure a first current through the first transistor and/or a second current through the second transistor and/or a third current through the third transistor and/or a fourth current through the fourth transistor during the period. In this case, a current, but also a plurality of currents through different transistors, can therefore be measured during the same phase, referred to as "Low Z" in the embodiments discussed and denoted R1 and R1' in the figures.

9. Driver apparatus according to Example 6 and Example 7 or Example 8, wherein the collision detection circuit is set up to detect that there is a collision state on the bus if the first current and/or the fourth current is/are lower than the second current and/or the third current. One possibility for detecting collisions in some embodiments is therefore, as described, the comparison of currents, in which case, as a result of the and/or combination, there are a number of possibilities which can be used individually or, for the purpose of providing redundancy, in combination with one another. In this example, the first current can be compared with the second current, the first current can be compared with the third current, the fourth current can be compared with the second current and/or the fourth current can be compared with the third current. This can be used both for the situation in Examples 6 and 7, in which the currents are measured in different phases, and for the situation in Example 8, in which the currents are measured in the same phase.

Example 10

Driver apparatus according to Example 6 and Example 7 or Example 8, wherein the collision detection circuit is set up to detect a collision state by comparing a difference between the first or fourth current and the second or third current with an associated threshold value. In this case, a difference between the first current and the second current, a difference between the first current and the third current, a difference between the fourth current and the second current or a difference between the fourth current and the third current or a plurality of these differences is/are therefore compared with a corresponding threshold value. This can again be used both for the situation in Examples 6 and 7, in which the currents are measured in different phases, and for the situation in Example 8, in which the currents are measured in the same phase.

Example 11

Driver apparatus according to one of Examples 6 to 8, wherein the collision detection circuit is set up to compare a collision state by comparing the first, second, third and/or fourth current with an associated threshold value. As already explained for Example 1, a collision state can already be detected by comparing a current with a threshold value, but a plurality of currents may also be used for the purpose of providing redundancy or detecting different collision states (for example CDD and CDR in the figures).

Example 12

Driver circuit according to Example 10 or 11, wherein the associated threshold value can be dynamically changed.

Example 13

Driver apparatus according to one of Examples 6-8, wherein
408888
the collision detection circuit comprises a sample-and-hold circuit for measuring the first, second, third and/or fourth current.

The observations and explanations for the above examples of the driver apparatus accordingly apply to the following examples of methods.

Example 14

Method for operating a differential bus, comprising:
controlling a first transistor and a fourth transistor in order to drive the bus to a dominant state,
controlling a second transistor and a third transistor in order to drive the bus to a recessive state,
measuring currents through at least one transistor of the first, second, third and fourth transistors, and detecting a collision state on the bus on the basis of the measured currents.

Example 15

Method according to Example 14, wherein the at least one transistor comprises at least two transistors, and wherein it is detected that there is a collision state on the bus if the currents through the at least two transistors differ.

Example 16

Method according to Example 14 or 15, wherein the collision state is detected only if the driver apparatus drives the bus to the recessive state.

Example 17

Method according to one of Examples 14-16, also comprising:
opening the first, second, third and fourth transistors if a collision state on the bus is detected.

Example 18

Method according to one of Examples 14-17, wherein:
the first transistor is connected between a first voltage connection and a first connection for a first bus line of the bus,
the fourth transistor is connected between a second voltage connection and a second connection for a second bus line of the bus,
the second transistor is connected between the first voltage connection and the second connection, and
the third transistor is connected between the second voltage connection and the first connection.

Example 19

Method according to Example 18, wherein the measuring of currents comprises measuring a first current through the first transistor and/or a fourth current through the fourth transistor, while the bus is driven to the dominant state.

Example 20

Method according to Example 18 or 19, wherein the measuring of currents comprises measuring a second current through the second transistor and/or a third current through the third transistor, while the bus is driven to the recessive state.

Example 21

Method according to Example 18, wherein the driving of the bus to the recessive state comprises closing the first transistor, the second transistor, the third transistor and the fourth transistor for a period, wherein the measuring of currents comprises measuring a first current through the first transistor and/or measuring a second current through the second transistor and/or measuring a third current through the third transistor and/or measuring a fourth current through the fourth transistor during the period.

Example 22

Method according to Example 19 and Example 20 or Example 21, wherein it is detected that there is a collision state on the bus if the first current and/or the fourth current is/are lower than the second current and/or the third current.

Example 23

Method according to Example 19 and Example 20 or Example 21, wherein a collision state on the bus is detected by comparing a difference between the first or fourth current and the second or third current with an associated threshold value.

Example 24

Method according to one of Examples 19 to 21, wherein a collision state on the bus is detected by comparing the first, second, third and/or fourth current with an associated threshold value.

Example 25

Driver circuit according to Example 23 or 24, wherein the associated threshold value can be dynamically changed.

Although specific exemplary embodiments have been described and illustrated in this description, persons with conventional expert knowledge will recognize that a multiplicity of alternative and/or equivalent implementations can be selected as a substitution for the specific exemplary embodiments shown and described in this description without departing from the scope of the invention shown. The intention is for this application to cover all adaptations or variations of the specific exemplary embodiments discussed here. Therefore, the intention is for this invention to be restricted only by the claims and the equivalents of the claims.

The invention claimed is:

1. A driver apparatus for a differential bus, the driver apparatus comprising:
   a first transistor and a fourth transistor which are connected in order to drive the differential bus to a dominant state,
   a second transistor and a third transistor which are connected in order to drive the differential bus to a recessive state, and
   a collision detection circuit which is configured to detect a collision state on the differential bus based on measurements of one or more currents through at least one transistor of the first, second, third and fourth transistors, and wherein the collision detection circuit is configured to open the first, second, third and fourth transistors if a collision state on the differential bus is detected.

2. The driver apparatus according to claim 1, wherein the at least one transistor comprises at least two transistors, wherein the collision detection circuit is configured to detect that there is a collision state on the bus if currents through the at least two transistors differ.

3. The driver apparatus according to claim 1, wherein the collision detection circuit is configured to detect the collision state only if the driver apparatus drives the differential bus to the recessive state.

4. The driver apparatus according to claim 1, wherein:
   the first transistor is connected between a first voltage connection and a first connection for a first bus line of the differential bus,
   the fourth transistor is connected between a second voltage connection and a second connection for a second bus line of the differential bus,
   the second transistor is connected between the first voltage connection and the second connection, and
   the third transistor is connected between the second voltage connection and the first connection.

5. The driver apparatus according to claim 4, wherein the collision detection circuit is configured to measure a first current through the first transistor and/or a fourth current through the fourth transistor, while the driver apparatus drives the differential bus to the dominant state.

6. The driver apparatus according to claim 4, wherein the collision detection circuit is configured to measure a second current through the second transistor and/or a third current through the third transistor, while the driver apparatus drives the differential bus to the recessive state.

7. The driver circuit according to claim 4, wherein the driver apparatus is configured to close the first transistor, the second transistor, the third transistor and the fourth transistor for a period for the purpose of driving the differential bus to the recessive state, wherein the collision detection circuit is configured to measure a first current through the first transistor and/or a second current through the second transistor and/or a third current through the third transistor and/or a fourth current through the fourth transistor during the period.

8. The driver apparatus according to claim 5, wherein the collision detection circuit is configured to detect that there is a collision state on the differential bus if the first current and/or the fourth current is/are lower than the second current and/or the third current.

9. The driver apparatus according to claim 5, wherein the collision detection circuit is configured to detect a collision state by comparing a difference between the first or fourth current and the second or third current with an associated threshold value.

10. The driver apparatus according to claim 5, wherein the collision detection circuit is configured to compare a collision state by comparing the first, second, third and/or fourth current with an associated threshold value.

11. The driver circuit according to claim 9, wherein the associated threshold value can be dynamically changed.

12. The driver apparatus according to claim 5, wherein the collision detection circuit comprises a sample-and-hold circuit for measuring the first, second, third and/or fourth current.

13. A method for operating a differential bus, the method comprising:

controlling a first transistor and a fourth transistor in order to drive the differential bus to a dominant state,
controlling a second transistor and a third transistor in order to drive the differential bus to a recessive state,
measuring currents through at least one transistor of the first, second, third and fourth transistors,
detecting a collision state on the differential bus on the basis of the measured currents; and
opening the first, second, third and fourth transistors if a collision state on the differential bus is detected.

14. The method according to claim 13,
wherein the at least one transistor comprises at least two transistors, and wherein the collision state is detected on the differential bus if the currents through the at least two transistors differ.

15. The method according to claim 13,
wherein the collision state is detected only if the driver apparatus drives the differential bus to the recessive state.

16. The method according to claim 13, wherein:
the first transistor is connected between a first voltage connection and a first connection for a first bus line of the differential bus,
the fourth transistor is connected between a second voltage connection and a second connection for a second bus line of the differential bus,
the second transistor is connected between the first voltage connection and the second connection, and
the third transistor is connected between the second voltage connection and the first connection.

17. The method according to claim 16, wherein
measuring currents comprises measuring a first current through the first transistor and/or a fourth current through the fourth transistor, while the differential bus is driven to the dominant state.

18. The method according to claim 16, wherein
measuring currents comprises measuring a second current through the second transistor and/or a third current through the third transistor, while the differential bus is driven to the recessive state.

19. The method according to claim 16, wherein controlling the second transistor and the third transistor in order to drive the differential bus to the recessive state further comprises closing the first transistor, the second transistor, the third transistor and the fourth transistor for a period, wherein measuring currents comprises measuring a first current through the first transistor and/or measuring a second current through the second transistor and/or measuring a third current through the third transistor and/or measuring a fourth current through the fourth transistor during the period.

20. The method according to claim 17, wherein a collision state is detected on the differential bus if the first current and/or the fourth current is/are lower than the second current and/or the third current.

21. The method according to claim 17, wherein a collision state on the differential bus is detected by comparing a difference between the first or fourth current and the second or third current with an associated threshold value.

22. The method according to claim 17, wherein a collision state on the differential bus is detected by comparing the first, second, third and/or fourth current with an associated threshold value.

23. The method according to claim 21, wherein the associated threshold value can be dynamically changed.

24. A driver apparatus for a differential bus, the driver apparatus comprising:
a first transistor and a fourth transistor which are connected in order to drive the differential bus to a dominant state,
a second transistor and a third transistor which are connected in order to drive the differential bus to a recessive state, and
a collision detection circuit which is configured to detect a collision state on the differential bus based on measurements of two or more currents through at least two transistors of the first, second, third and fourth transistors, wherein the collision detection circuit is configured to detect that there is a collision state on the bus if currents through the at least two transistors differ.

25. A method for operating a differential bus, the method comprising:
controlling a first transistor and a fourth transistor in order to drive the differential bus to a dominant state,
controlling a second transistor and a third transistor in order to drive the differential bus to a recessive state,
measuring currents through at least two transistors of the first, second, third and fourth transistors, and
detecting a collision state on the differential bus on the basis of the measured currents, wherein the collision state is detected on the differential bus if the currents through the at least two transistors differ.

* * * * *